United States Patent [19]

Iwamatsu

[11] 4,217,555

[45] Aug. 12, 1980

[54] AMPLIFIER CIRCUIT ARRANGEMENT WITH STABILIZED POWER-SUPPLY CURRENT

[75] Inventor: Masayuki Iwamatsu, Hamamatsu, Japan

[73] Assignee: Nippon Gakki Seizo Kabushiki Kaisha, Hamamatsu, Japan

[21] Appl. No.: 968,431

[22] Filed: Dec. 8, 1978

[30] Foreign Application Priority Data

Dec. 16, 1977 [JP] Japan ............................ 52/151521

[51] Int. Cl.² .......................................... H03F 3/18
[52] U.S. Cl. .................................. 330/267; 330/297; 330/301
[58] Field of Search ............... 330/199, 200, 202, 148, 330/297, 301, 296, 263, 267

[56] References Cited

U.S. PATENT DOCUMENTS

| | | | |
|---|---|---|---|
| 3,247,462 | 4/1966 | Kobbe | 330/301 |
| 3,461,397 | 8/1969 | Cunningham | 330/301 X |

OTHER PUBLICATIONS

James, "Balanced Output Amplifier," *Wireless World* Dec. 1975, vol. 81, No. 1480 p. 576.

*Primary Examiner*—James B. Mullins
*Attorney, Agent, or Firm*—Cushman, Darby & Cushman

[57] ABSTRACT

In an amplifier comprising a signal-amplifying circuit for amplifying an input signal to the amplifier and a power-supply circuit for supplying power to the signal amplifying circuit for operation, there is provided an additional amplifying circuit driven by the output signal of the signal-amplifying circuit and powered from said power circuit. Changes in the power-supply currents for the respective amplifying circuits cancel each other. Thus, the total current supplied from the power supply circuit is maintained constant.

6 Claims, 4 Drawing Figures

AMPLIFIER CIRCUIT ARRANGEMENT WITH STABILIZED POWER-SUPPLY CURRENT

BACKGROUND OF THE INVENTION (a) Field of the Invention

The present invention relates to an amplifier for use to amplify electrical signals with a power-supply circuit providing a stabilized power-supply current.

(b) Description of the prior art

An amplifier generally comprises a signal amplifying circuit for amplifying an input signal to the amplifier and a power-supply circuit for supplying power to the amplifying circuit for operation. In general, the overall signal-amplifying operation of the amplifier considerably depends upon the performance of the power-supply circuit, such as voltage regulation and impedance, including power supply lines through which power is supplied to the signal-amplifying circuit. If the voltage regulation of the power-supply circuit is poor, the power-supply voltage applied to the signal-amplifying circuit will fluctuate due to changes in the power-supply current for the circuit in accordance with the input signal, and in turn, the signal-amplifying operation of the signal-amplifying circuit will become deteriorated. In the instance wherein the signal-amplifying circuit has a plurality of signal channels, such fluctuations in the power-supply voltage can lead to a poor separation between the signal channels. Thus, a power-supply circuit employed in an amplifier has to be carefully designed to provide as good performance as possible. However, it generally is a very difficult and costly task to achieve such an ideal power-supply circuit that has no impedance and zero voltage fluctuation.

In the past, therefore, a larger part of the amplifier-designing effort has been paid to improvement of the SVRR (Supply voltage rejection ratio) of the signal-amplifying circuit in an amplifier, rather than the power-supply circuit, by means of the employment of a cascode configuration, stabilization of biasing voltages for amplifying elements in the signal-amplifying circuit, NFB (negative feedback) technique, and like means. Such approaches, however, are liable to make the entire amplifier more complicated and expensive, and practically are not able to sufficiently overcome the problems due to the limited performance of the employed power-supply circuit.

An amplifier usually has another problem which is caused by signal current flow on the ground line in the amplifier, which line may be one of the power supply lines. That is, various signal currents, main part of which is the output signal current of the signal-amplifying circuit, flow on the ground line and develop corresponding voltage drops along the line. These voltage drops can be fed back to the input side of the signal-amplifying circuit, rendering the operation of the amplifier unstable, since such voltage drops change with the input signal which is applied to the amplifier. In case the amplifier has a plurality of signal channels, the above feed-back of the ground-line voltage drops can severely hamper the channel-separation characteristic. The improvement of the SVRR of the signal-amplifying circuit is not much effective for overcoming this problem.

SUMMARY OF THE INVENTION

It is, therefore, an object of the present invention to provide an amplifier which provides good and stable signal-amplifying operation and which is simple in arrangement and is inexpensive.

Another object of the present invention is to provide an amplifier of the type described above, in which the limited performance of the power-supply circuit, for example an existing impedance thereof, has substantially no adverse effect on the signal-amplifying operation of the signal amplifying circuit.

Still another object of the present invention is to provide an amplifier of the type described above, in which unrequired influence upon the signal-amplifying operation, caused by signal currents flowing through the ground line, is prevented.

In an amplifying circuit, generally, the power-supply current varies in accordance with the input signal and the output signal. Also, the relationship between the variations in the power-supply current and the input or output signal can be specified according to the circuit design. Based on this consideration, the present invention has been worked out to provide an improved amplifier of the type described above, which relies on an additional amplifying circuit, other than the signal-amplifying circuit of the amplifier, which is used to compensate for the changes in power supply current coming from the power supply circuit, thereby stabilizing the power-supply current to be constant independently of the input signal so that the power-supply voltage applied to the signal-amplifying circuit is also stabilized. Considering the principle of the present invention, it will be understood that the present invention is particularly advantageous and effective when applied to a class A amplifier.

According to the present invention, there is provided an amplifier which comprises: a signal-amplifying circuit for amplifying an input signal to the amplifier and delivering an amplified input signal; an additional amplifying circuit driven by a drive signal associated with said input signal; and a power-supply circuit, common to the two amplifying circuits, for supplying power through common power-supply lines to said two amplifying circuits for operation thereof, changes in power-supply currents for said respective amplifying circuits cancelling each other on said common power-supply lines whereby a current flowing on each of said common power supply lines being always maintained constant independently of said input signal.

According to the preferred embodiment of the present invention, such additional amplifying circuit is arranged to cause a current-flow on the ground line for cancelling therewith the output-signal current of the signal-amplifying circuit which flows on the ground line.

These and other objects as well as the features and the advantages of the present invention will become apparent by reading the following detailed description of the preferred embodiment of the present invention when taken in conjunction with the accompanying drawings.

DETAILED DESCRIPTION OF THE PREFERRED EMBODIMENT

Figure 1:
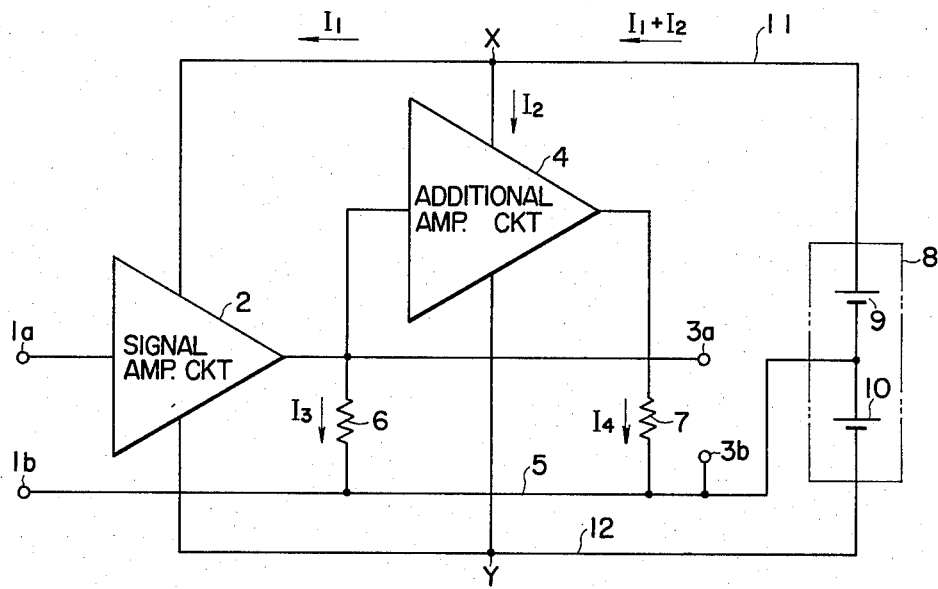
FIG. 1 is a block diagram for functionally showing an example of an amplifier according to the present invention.

An example of an amplifier according to the present invention is shown in FIG. 1 in functional block diagram form, which basically comprises a signal-amplifying circuit 2 for amplifying an input signal applied between terminals 1a and 1b, and a balanced or split power supply circuit 8 for supplying power to the signal-amplifying circuit 2 for operation through power-supply lines 11 and 12. The power-supply circuit 8 consists of a positive power source 9 and a negative power source 10, each being illustrated as a battery in the drawing. The respective power-supply lines 11 and 12 are led from the positive and negative terminals of the power supply sources 9 and 10. The neutral terminal of the power supply circuit 8, i.e. the joint point of the negative and positive terminals of the sources 9 and 10, is connected to a ground line 5 to which is connected terminals 1b and 3b. The output point of the signal-amplifying circuit 2 is connected to a terminal 3a and also to the ground line 5 via its load resistor 6. The amplifier of the present invention further comprises an additional amplifying circuit 4 which receives, as its input or drive signal, the output signal of the signal-amplifying circuit 2 which is delivered at the terminal 3a. The output point of the additional amplifying circuit 4 is connected to the ground line 5 via its load resistor 7. The operating power for additional amplifying circuit 4 is supplyed from the power supply lines 11 and 12 at points X and Y where these lines branch off to the respective amplifying circuits 2 and 4. Accordingly, part of the power line 11 between the branching point X and the positive terminal of the power supply circuit 8 carries the total of power supply currents $I_1$ and $I_2$ for the respective amplifying circuits 2 and 4. This is also true with the negative power supply line 12.

The two amplifying circuits 2 and 4 are designed so that their power supply currents $I_1$ and $I_2$ will change through a same amount but in an opposite phase, for a given variation in the level of the input signal to the amplifier, and also that the output-signal currents $I_3$ and $I_4$ through the load resistors 6 and 7 will have a same value opposite in phase. In the instant example, the signal-amplifying circuit 2 is a non-inverting voltage amplifying circuit of class A operation with substantially zero output impedance, and the additional amplifying circuit 4 is formed as an inverting voltage amplifying circuit of class A operation with a voltage gain of unity (one), having an almost infinite input impedance and substantially zero output impedance. Furthermore, the load resistors 6 and 7 are set to be of the same resistance.

Figure 2:
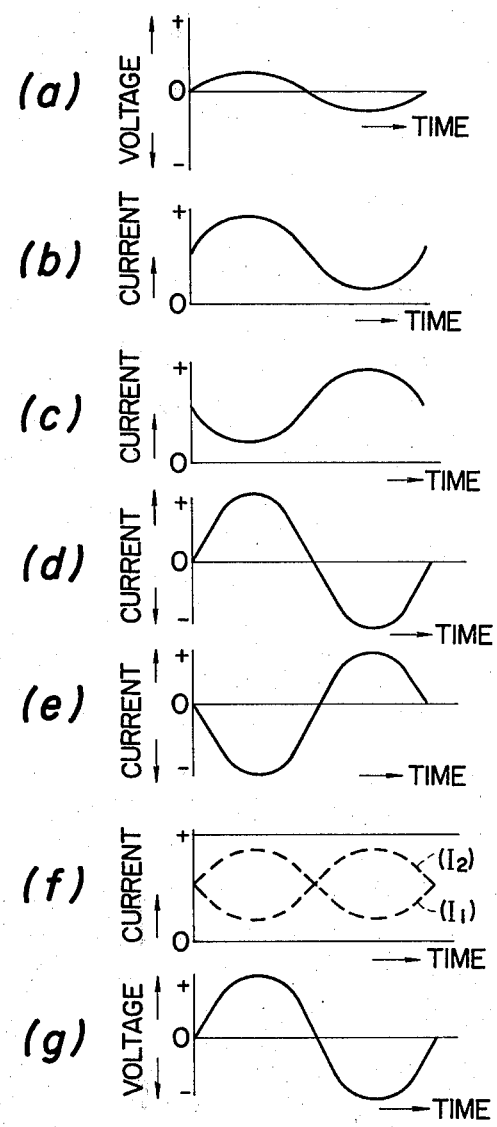
FIG. 2 is a time chart for showing voltage and current waveforms at various points in the amplifier shown in FIG. 1.

The waveforms of those voltages or currents at various points in the amplifier shown in FIG. 1 are illustrated in the time chart of FIG. 2. In this Figure, FIG. 2(a) represents the input signal voltage applied between the terminals 1a and 1b; FIG. 2(b) represents the power supply current $I_1$ for the signal-amplifying circuit 2; FIG. 2(c) represents the power supply current $I_2$ for the additional amplifying circuit 4; FIG. 2(d) represents the output signal current $I_3$ of the signal-amplifying circuit 2; FIG. 2(e) represents output signal current $I_4$ of the additional amplifying circuit 4; FIG. 2(f) represents the total power supply current $I_1 + I_2$ on the power supply line; and FIG. 2(g) represents the output signal voltage of the signal-amplifying circuit 2. Referring to the time chart, the fact will be easily observed that the power-supply currents $I_1$ and $I_2$ for the respective amplifying circuits 2 and 4 fluctuate up and down their idling current levels, in response to the input signal of the amplifier. The fluctuations in the power-supply currents $I_1$ and $I_2$ are the same in amount but are 180° out of phase to each other, and cancel each other on the power supply lines. Accordingly, there occurs no change in the voltage drops in the impedance of the power-supply lines extending between the "points X and Y" and the "power supply circuit terminals" and in the internal impedance of the power supply circuit 8. Namely, the voltages at the points X and Y are kept constant, irrespective of variations in the individual power-supply currents $I_1$ and $I_2$. When the voltage drop across the points X and Y and the signal amplifying circuit 2 is sufficiently small, which can be easily achieved, the power-supply voltage applied to the signal-amplifying circuit 2 is maintained substantially constant. Thus, the signal-amplifying circuit 2 is free from unrequired influence from the imperfect regulation of the power-supply circuitry including the circuit 8 and the power supply lines 11 and 12. Now, the output-signal currents $I_3$ and $I_4$ through the load resistors 6 and 7 have the same value but opposite in phase, thereby causing voltage drops on the ground line 5 to be canceled with each other, giving substantially no effect upon the signal-amplifying operation by the signal-amplifying circuit 2.

It should be understood that this signal-amplifying circuit 2 may be an inverting voltage-amplifying circuit and also that the respective amplifying circuits 2 and 4 may be formed as a power-amplifying circuit. In the latter case, the load for the circuit 2 is connected between the output terminals 3a and 3b of the amplifier.

Figure 3:
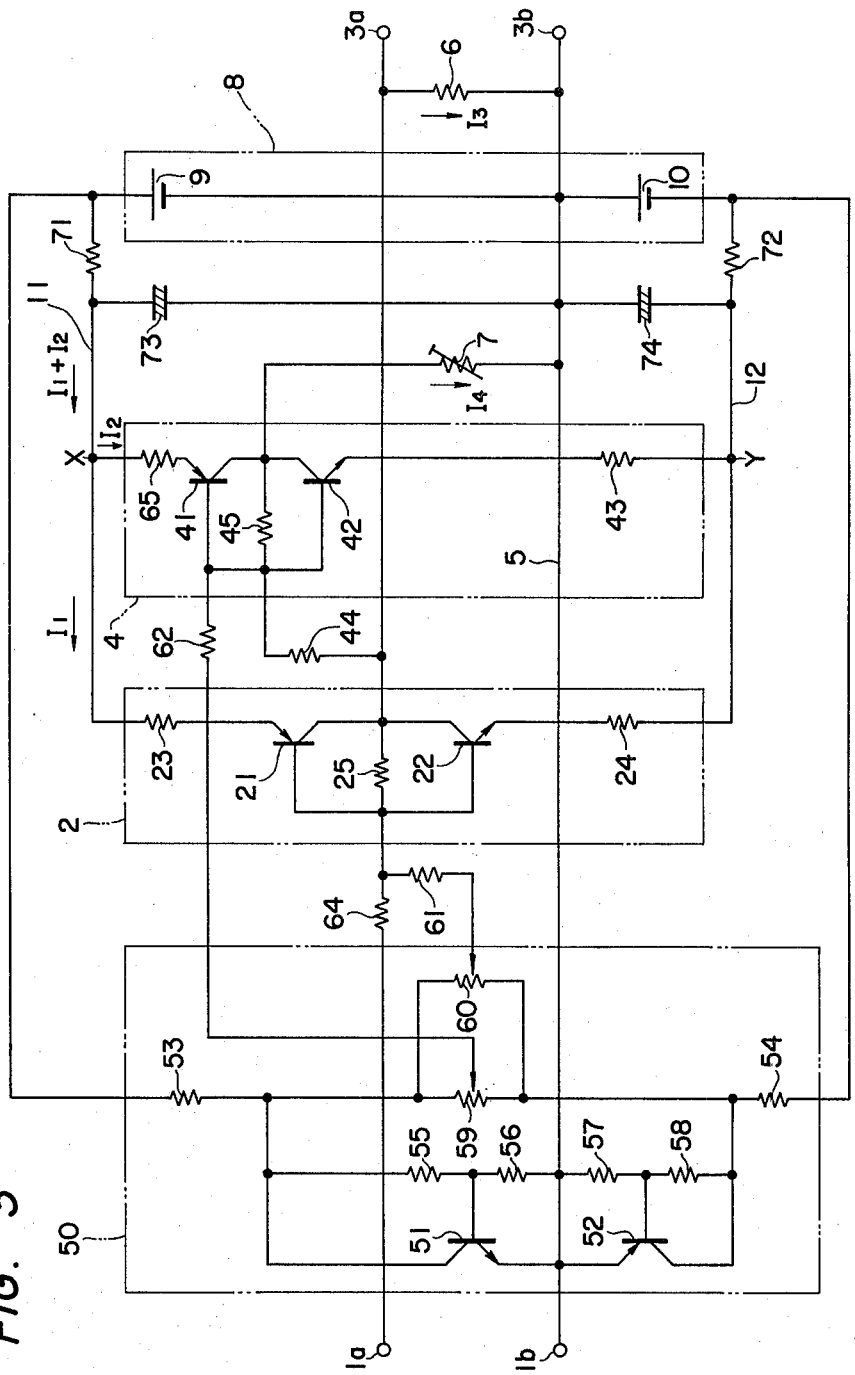
FIG. 3 is a circuit diagram for showing a concrete example of an amplifier according to the present invention.

FIG. 3 shows a more concrete example of an amplifier according to the present invention. This embodiment has essentially the same functional block diagram as that shown in FIG. 1 except that the signal-amplifying circuit is an inverting one, and therefore corresponding portions in these drawings are indicated by like reference numerals and symbols.

In FIG. 3, the signal-amplifying circuit 2 is formed with a complementary push-pull circuit comprised of a pnp transistor 21 and an npn transistor 22 coupled to each other at their bases and collectors. The emitters of the respective transistors 21 and 22 are connected via resistors 23 and 24 to the positive and negative power supply lines 11 and 12. The input point of the signal-amplifying circuit 2, i.e. the joint of the bases of the transistors 21 and 22, is connected via an input resistor 64 to the input terminal 1a of the amplifier, and also connected via a negative feedback resistor 25 to the joint of the collectors which, in turn, is connected to the output terminal 3a. The additional amplifying circuit 4 is constructed by another complementary push-pull circuit which, in turn, is comprised of a pnp transistor 41 and an npn transistor 42 coupled to each other at their bases and collectors. The emitter of the transistor 41 is connected via a resistor 65 to the positive power supply line 11, while the emitter of the transistor 42 is connected via a resistor 43 to the negative power supply line 12. The input point of the additional amplifying circuit 4, i.e. the joint of the bases of the transistors 41 and 42, is coupled via a resistor 44 to the output point of the signal amplifying circuit 2 and also to the output point of the additional amplifying circuit 4, i.e. the joint of collectors of the transistors 41 and 42, via a resistor 45 for negative feedback. The transistors in the respective amplifying circuits 2 and 4 are adapted to be biased for class A mode operation, by a biasing circuit 50.

The biasing circuit 50 is comprised of an npn transistor 51, a pnp transistor 52, resistors 53 to 58, and potentiometers 59 and 60. The collectors of the transistors 51 and 52 are connected via the resistors 53 and 54 to the positive and negative terminals of the balanced power supply circuit 8, respectively, and their emitters are connected to the ground line 5. The resistors 55 and 56 are connected between the base and the collector of the transistor 51, and between its base and emitter, respectively. A resistor 57 is connected between the base and the emitter of the transistor 52, and a resistor 58 is connected between its base and collector. Between the collectors of the transistors 51 and 52 are parallelly connected potentiometers 59 and 60. From the slider taps of the potentiometers 59 and 60, regulated biasing currents are supplied to the bases of the transistors in the signal amplifying and additional-amplifying circuits 2 and 4 through resistors 61 and 62, respectively, so that these amplifying circuits 2 and 4 operate in Class A mode.

In this embodiment, there is provided in the power-supply lines 11 and 12 a filter network consisting of resistors 71 and 72 arranged in series across the lines 11 and 12, and capacitors 73 and 74 connected between the positive and negative lines 11 and 12 and the positive and negative terminals of the power-supply circuit 8. This filter network is provided for lowering the effective impedance of the power supply system to signal components of current.

Figure 4:
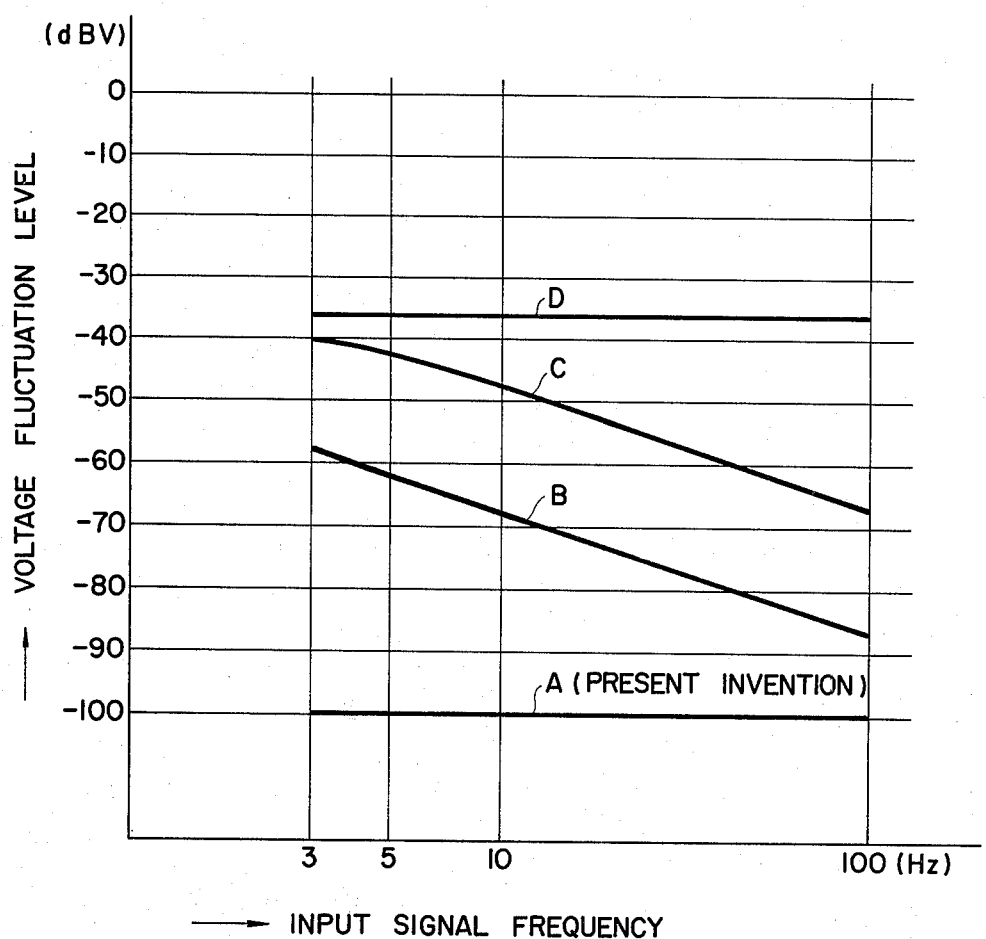
FIG. 4 is a chart showing an example of regulation curve of the power-supply circuit involving its power-supply lines, which circuit is employed in the amplifier shown in FIG. 3.

FIG. 4 shows the results of an experiment conducted on the amplifier of FIG. 3 to clarify the advantage of the present invention. In FIG. 4, the linear line A plots fluctuations of the power supply voltage which are measured at the point X or Y by using a vacuum-tube voltmeter having an input impedance of 100 kΩ, as the frequency of the input signal to the amplifier is varied from 3 to 100 Hz, while the input signal being kept at such a constant level as will obtain a constant output level of 155 mV between the terminals 3a and 3b. In such an instance, the filter capacitors 73 and 74 are either 470 μF or 6800 μF. As shown by the line A, the measured voltage fluctuations are always at an extremely low level that can be compared with the noise level in the employed measurement system including the vacuum-tube voltmeter. In contrast thereto, when the additional amplifying circuit 4 is removed from the amplifier of FIG. 3, the result of a similar experiment is plotted as shown by curved or linear lines B to D. For the lines B, C and D, capacitances of the filter capacitors 73 and 74 are 6800 μF, 470 μF and 0 μF (removed), respectively.

A comparison of the line A with the lines B to D clearly indicates the fact that the additional amplifying circuit 4 in the amplifier of the present invention serves to greatly improve or decrease the effective impedance and voltage regulation of the power-supply circuitry including the power-supply lines 11 and 12 and the power-supply circuit 8. This means that the power-supply voltage for the signal amplifying circuit 2 is highly stabilized at a constant level, irrespective of changes in the input signal and irrespective of even whether or not the input signal is present. According to the present invention, therefore, the deterioration of the amplifier operation characteristic due to the limited performance of the power-supply circuit employed can be prevented substantially so that the amplifier of the present invention can provide a remarkably improved performance.

As is apparent from the foregoing description, the present invention provides an improved amplifier in which the limited performance of the power supply circuit employed and signal current flow on the ground line have substantially no ill influence upon the overall signal-amplifying operation of the amplifier. Also, an amplifier of the present invention is generally simple in arrangement and therefore inexpensive.

What is claimed is:

1. An amplifier comprising:
   a first single-ended complementary push-pull amplifying circuit operating in class A mode with a first operating current and having an input receiving an input signal to said amplifier and an output;
   a second single-ended complementary push-pull amplifying circuit comprising an inverting amplifier circuit operating in class A mode with a second operating current and having an input connected to the output of said first amplifying circuit and an output;
   a balanced power supply circuit common to said first and second amplifying circuits for supplying said first and second operating currents and having an electrically neutral point connected to a ground line of said amplifier, so that the total current supplied from said power supply circuit to said amplifying circuits is maintained constant;
   a first load connected between the output of said first amplifying circuit and said ground line; and
   a second load connected between the output of said second amplifying circuit and said ground line.

2. An amplifier according to claim 1, in which: said first and second operating currents for the respective amplifying circuits are supplied through a common power-supply line from said power supply circuit.

3. An amplifier according to claim 1, in which: said second amplifying circuit has a voltage gain of unity; and said first and second loads have the same impedance.

4. An amplifier according to claim 1, further comprising a biasing circuit for biasing each of said first and second amplifying circuits to operate in class A mode.

5. An amplifier according to claim 4, in which: said biasing circuit is powered from said power supply circuit, said amplifier further comprising a filter network provided between said power supply circuit and said first and second amplifying circuits.

6. An amplifier according to claim 1, in which: said second load comprises a variable resistor.

* * * * *

UNITED STATES PATENT AND TRADEMARK OFFICE
CERTIFICATE OF CORRECTION

PATENT NO. : 4,217,555
DATED : August 12, 1980
INVENTOR(S) : Masayuki IWAMATSU

It is certified that error appears in the above—identified patent and that said Letters Patent is hereby corrected as shown below:

In the heading

Please correct:

[75] Inventor: Masayuki Iwamatsu, Iwata-gun, Shizuoka-ken, Japan

Signed and Sealed this

Tenth Day of March 1981

[SEAL]

Attest:

RENE D. TEGTMEYER

Attesting Officer     Acting Commissioner of Patents and Trademarks